(12) United States Patent
Torii

(10) Patent No.: US 6,675,367 B1
(45) Date of Patent: Jan. 6, 2004

(54) SEMICONDUCTOR INTEGRATED CIRCUITS AND METHOD FOR DESIGNING THE SAME

(75) Inventor: Kensuke Torii, Fujimi-machi (JP)

(73) Assignee: Seiko Epson Corporation, Tokyo (JP)

(*) Notice: Subject to any disclaimer, the term of this patent is extended or adjusted under 35 U.S.C. 154(b) by 177 days.

(21) Appl. No.: 09/594,515

(22) Filed: Jun. 13, 2000

(30) Foreign Application Priority Data

Jun. 14, 1999 (JP) .......................................... 11-166938
Jun. 5, 2000 (JP) ..................................... 2000-167840

(51) Int. Cl.[7] ............................................. G06F 17/50
(52) U.S. Cl. ............................... 716/14; 716/12; 716/13
(58) Field of Search ............................... 716/14, 8–13; 438/128–129; 257/207

(56) References Cited

U.S. PATENT DOCUMENTS

| | | | | |
|---|---|---|---|---|
| 5,824,570 A | * | 10/1998 | Aoki et al. ................. | 438/128 |
| 5,952,684 A | * | 9/1999 | Tashiro ....................... | 257/207 |
| 5,972,740 A | * | 10/1999 | Nakamori ................... | 438/129 |
| 5,978,572 A | * | 11/1999 | Toyonaga et al. ...... | 395/500.06 |
| 6,057,169 A | * | 5/2000 | Singh et al. ................. | 438/14 |

* cited by examiner

Primary Examiner—Vuthe Siek
(74) Attorney, Agent, or Firm—Hogan & Hartson, LLP

(57) ABSTRACT

A method of designing a semiconductor integrated circuit makes it possible to reduce the amount of manual routing of a power wire. After a $V_{DD}$ power wire for a circuit block and a $V_{SS}$ power wire for the circuit block have been routed, the number and positions of y-direction $V_{DD}$ power wires are determined from consideration of the positions thereof. A first y-direction $V_{DD}$ power wire among the y-direction $V_{DD}$ power wires is used without being in contact with edges of the $V_{SS}$ power wire for the circuit block, but it overlays the routing position thereof. For that reason, non-selection of that first y-direction $V_{DD}$ power wire is determined. The other y-direction $V_{DD}$ power wires are subsequently routed automatically.

4 Claims, 7 Drawing Sheets

SEMICONDUCTOR INTEGRATED CIRCUITS AND METHOD FOR DESIGNING THE SAME

BACKGROUND OF THE INVENTION

1. Field of the Invention

The present invention relates to a method of designing a semiconductor integrated circuit such as a standard cell.

2. Description of Related Art

Automated design techniques for semiconductor integrated circuits have recently improved so much, this automatic design is widely used in the semi-customization of components such as standard cells. In the automatic design, automated routing is used for the power wires. This makes it possible to reduce the manual labor required by the routing of power wires.

However, it is necessary for the designers to do some manual labor, even with automated routing. In other words, if a $V_{DD}$ power wire and a $V_{SS}$ power wire should overlap after the automated routing, by way of example, the designers much adjust that portion manually. This causes an increase in the time required for routing the power wire.

SUMMARY OF THE INVENTION

An objective of the present invention is to provide a method of designing a semiconductor integrated circuit that makes it possible to reduce, or even eliminate, the manual work that must be done by the designers during the automated routing of a power wire.

The present invention relates to a method of designing a semiconductor integrated circuit including a circuit block, the method comprising:

a step of placing the circuit block;

a step of routing a power wire for a circuit block that supplies power to the circuit block, the power wire including a first edge extending in a first direction and a second edge extending in a second direction; and a step of selecting a first-direction power wire to be routed in a first direction by automated routing, after the step of routing the power wire for a circuit block, taking into consideration a position of the power wire for a circuit block.

Since this aspect of the invention ensures that the position of a power wire for a circuit block is determined first, the first-direction power wire can be selected from consideration of the position of the power wire for a circuit block. For that reason, it is possible to reduce or even eliminate the manual work of correcting the first-direction power wire, after the first-direction power wire has been routed automatically. Note that the step of placing circuit block and the step of routing the power wire for a circuit block can be done in either order or could be done simultaneously.

The present invention further relates to a method of designing a semiconductor integrated circuit including a circuit block, the method comprising:

a step of placing an I/O port;

a step of placing the circuit block;

a step of routing a power wire for a circuit block that includes a first edge extending in a first direction and a second edge extending in a second direction and supplies power to the circuit block; and a step of selecting a first-direction power wire that is routed by automated routing and is connected to the I/O port, after the step of routing the power wire for a circuit block, from consideration of a position of the power wire for a circuit block.

Since the position of the power wire for a circuit block is determined first in accordance with this aspect of the invention, the first-direction power wire to be connected to the I/O port can be selected from consideration of the position of that power wire for a circuit block. For that reason, it is possible to reduce or even eliminate the manual work of the designers during the automated routing of the first-direction power wires. Note that the step of placing the I/O port, the step of placing circuit block, and the step of routing the power wire for the circuit block can be done in any order or could be done simultaneously.

The present invention still further relates to a method of designing a semiconductor integrated circuit including a circuit block, the method comprising:

a step of placing the circuit block; and a step of selecting a power wire to be routed by automated routing, after the step of placing the circuit block, from consideration of a position of the circuit block.

Since the position of the circuit block is determined first in accordance with this aspect of the invention, the power wire can be selected from consideration of the position of the circuit block. For that reason, it is possible to reduce or even eliminate the manual work of the designers during the automated routing of power wires. This aspect of the present invention may comprise: a step of routing a power wire for a circuit block that supplies power to the circuit block, before the step of selecting a power wire. In this aspect of the present invention, the power wire for a circuit block may comprise a first edge extending in a first direction and a second edge extending in a second direction. In this aspect of the present invention, the power wire that is routed by automated routing may be a first-direction power wire extending in a first direction.

In the present invention, the step of selecting the first-direction power wire may select a power wire at a position that enables connection to the second edge. Here, the power wire for a circuit block and the first-direction power wire may be $V_{DD}$ power wires or $V_{SS}$ power wires. Note that the first-direction power wire and the second edge of the power wire for a circuit block are positioned in separate upper and lower layers, so that connection therebetween is done by a conductive layer formed in a through hole.

In the present invention, the step of selecting the first-direction power wire may perform the selection in a manner to avoid a wire at a position that overlays the first edge. The meaning thereof is discussed below. Assume that the first direction is the y-axis direction, by way of example. When the x-coordinate of a first-direction power wire is the same as that of the first edge of the power wire for a circuit block, these two wires are in the same layer so the first-direction power wire overlays the first edge of the power wire for a circuit block. For that reason, when the power wire for a circuit block is a $V_{DD}$ power wire and the first-direction power wire is a $V_{SS}$ power wire, by way of example, it is not possible to route the first-direction power wire. In such a case, it is determined to not-select this first-direction power wire. In the present invention, the power wire for a circuit block may be a $V_{DD}$ power wire and the first-direction power wire may be a $V_{SS}$ power wire, or the power wire for a circuit block may be a $V_{SS}$ power wire and the first-direction power wire may be a $V_{DD}$ power wire.

The present invention may further comprise a step of automatically routing the first-direction power wire, after the step of selecting the first-direction power wire.

In the present invention, the power wire for a circuit block may comprise an encircling power wire. An encircling power wire is a power wire such that one end portion is connected to the other end portion thereof. The shape of the encircling power wire could have a circular frame or a quadrilateral frame, by way of example.

In the present invention, the circuit block may comprise at least one of ROM, RAM, an analog circuit, a control circuit, and an interface circuit.

In the present invention, the semiconductor integrated circuit may comprise at least one of a standard cell, a gate array, and an embedded array.

DESCRIPTION OF PREFERRED EMBODIMENTS

First Embodiment

A first embodiment of the present invention will now be described with reference to the accompanying drawings.

Figure 4:
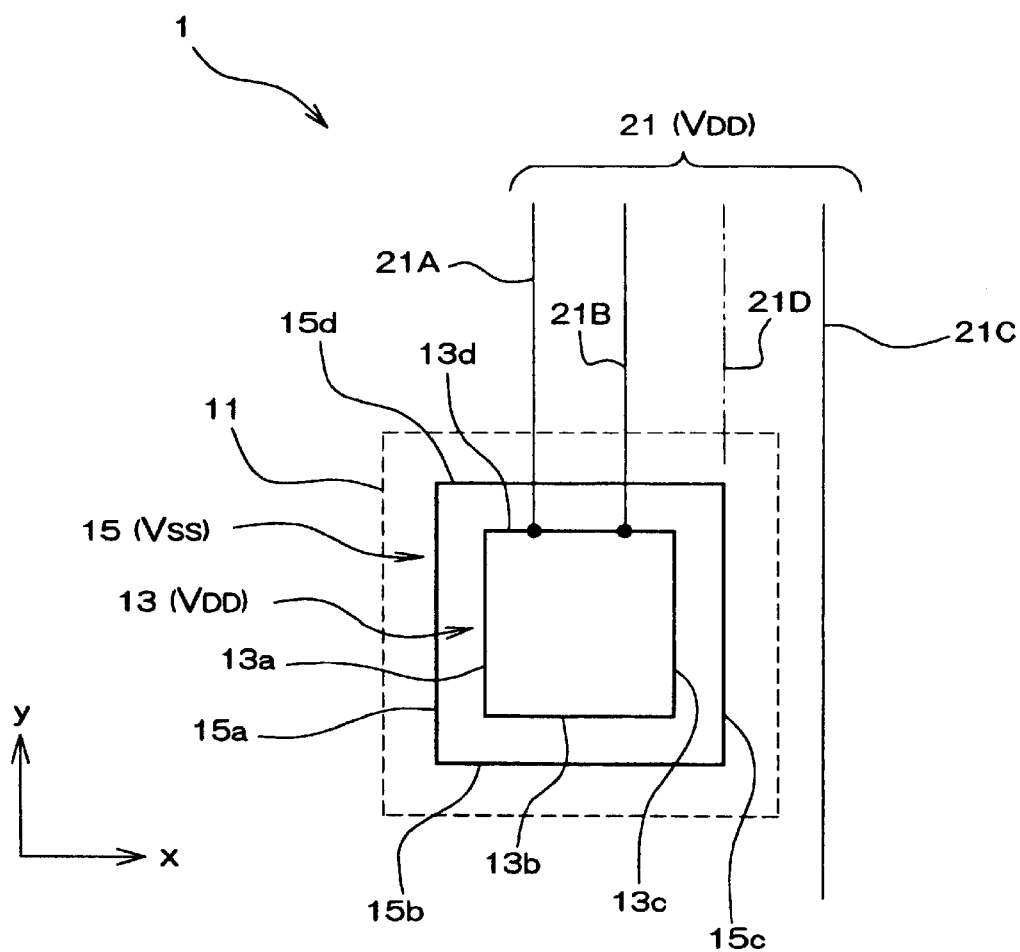
FIG. 4 is a plan view of the semiconductor integrated circuit 1 in accordance with the first embodiment of the present invention.

A plan view of a semiconductor integrated circuit 1 in accordance with the first embodiment of the present invention is shown in FIG. 4. This figure shows the placement relationship between a circuit block 11 and y-direction $V_{DD}$ power wires 21. Note that the y-direction $V_{DD}$ power wires 21 also appear herein as the $V_{DD}$ power wires 21.

The circuit block 11 is ROM, RAM, an analog circuit, a control circuit, or an interface circuit and is provided with a $V_{DD}$ power wire 13 for the circuit block and a $V_{SS}$ power wire 15 for the circuit block, for supplying power thereto. The circuit block 11 can be of any shape, but in this embodiment it is quadrilateral. Note that the $V_{DD}$ power wire 13 for the circuit block also appears herein as the $V_{DD}$ power wire 13 and the $V_{SS}$ power wire 15 for the circuit block also appears herein as the $V_{SS}$ power wire 15.

The $V_{DD}$ power wire 13 is within the circuit block 11 and is placed so as to surround the circuitry (such as ROM, RAM, or analog circuitry) disposed within the circuit block 11. The $V_{SS}$ power wire 15 is also within the circuit block 11 and is placed so as to surround the circuitry of the circuit block 11 and the $V_{DD}$ power wire 13.

The $V_{DD}$ power wire 13 and the $V_{SS}$ power wire 15 form encircling power wires. An encircling power wire is a power wire such that one end portion is connected to the other end portion thereof. Since the positions of power wires within the circuitry of the circuit block 11 are not known, the encircling power wire is placed on the outer side of the circuitry. This ensures that the power wires within the circuitry can connect to the encircling power wire, regardless of the positions of the power wires within the circuitry. Note that each encircling power wire can be of any shape, but in this embodiment they have a quadrilateral framework. In addition, the $V_{SS}$ power wire 15 is described herein as being placed on the outer side of the $V_{DD}$ power wire 13, but the $V_{DD}$ power wire 13 could equally well be placed on the outer side of the $V_{SS}$ power wire 15. In addition, the $V_{DD}$ power wire 13 and the $V_{SS}$ power wire 15 are described herein as being encircling power wires, but they could equally well be stripe-shaped power wires or power wires that are configured from edges extending in the x-direction and in the y-direction.

The configurations of the $V_{DD}$ power wire 13 and the $V_{SS}$ power wire 15 in this case are described below in more detail. The $V_{DD}$ power wire 13 is provided with an edge 13a extending in the y-direction in the figure, an edge 13b connected to the edge 13a and extending in the x-direction in the figure, an edge 13c connected to the edge 13b and extending in the y-direction in the figure, and an edge 13d connected to the edges 13c and 13a and extending in the x-direction in the figure. The $V_{SS}$ power wire 15 has the same configuration as that of the $V_{DD}$ power wire 13 in that it is provided with edge 15a extending in the y-direction in the figure, an edge 15b connected to the edge 15a and extending in the x-direction in the figure, an edge 15c connected to the edge 15b and extending in the y-direction in the figure, and an edge 15d connected to the edges 15c and 15a and extending in the x-direction in the figure.

The y-direction $V_{DD}$ power wires 21 extend linearly in the y-direction and formed of a plurality of $V_{DD}$ power wires, and are represented by the y-direction $V_{DD}$ power wires 21A, 21B, and 21C in the figure. The description herein refers to first-direction power wires.

The y-direction $V_{DD}$ power wires 21A and 21B are connected to the $V_{DD}$ power wire 13 for the circuit block. This ensures that the $V_{DD}$ power wire 13 for the circuit block is connected to the power source by the y-direction $V_{DD}$ power wires 21A and 21B. The y-direction $V_{DD}$ power wire 21C, on the other hand, is placed in the neighborhood of the circuit block 11 and is connected to a $V_{DD}$ power wire for another circuit block.

Note that there are also y-direction $V_{SS}$ power wires that extend in the y-direction and are connected to the $V_{SS}$ power wire 15 for the circuit block, but since they are similar to the y-direction $V_{DD}$ power wires 21A, 21B, and 21C, further description thereof is omitted.

The $V_{DD}$ power wire 13 for the circuit block, the $V_{SS}$ power wire 15 for the circuit block, are the y-direction $V_{DD}$ power wires 21A, 21B, and 21C are power wires that extend in the x-direction and power wires that extend in the y-direction. The power wires that extend in the x-direction are the edge 13b of the $V_{DD}$ power wire 13, the edge 13d of the $V_{DD}$ power wire 13, the edge 15b of the $V_{SS}$ power wire 15, and the edge 15d of the $V_{SS}$ power wire 15. The power wires that extend in the y-direction are the edge 13a of the $V_{DD}$ power wire 13, the edge 13c of the $V_{DD}$ power wire 13, the edge 15a of the $V_{SS}$ power wire 15, the edge 15c of the $V_{SS}$ power wire 15, and the $V_{DD}$ power wires 21A, 21B, and 21C.

Either the group of power wires that extends in the x-direction or the group of power wires that extends in the y-direction are within an upper layer and the other group of power wires is within a lower layer, with an interlayer dielectric therebetween. Thus, when a power wire that extends in the x-direction is to be connected to a power wire that extends in the y-direction (if the edge 13a of the $V_{DD}$ power wire 13 for the circuit block is to be connected to the edge 13b of the $V_{DD}$ power wire 13 for the circuit block, or the edge 13d of the $V_{DD}$ power wire 13 for the circuit block is to be connected to the y-direction $V_{DD}$ power wires 21A and 21B, by way of example), those wires can be connected by a conductive layer within a through-hole that is formed in the interlayer dielectric.

Figure 1:
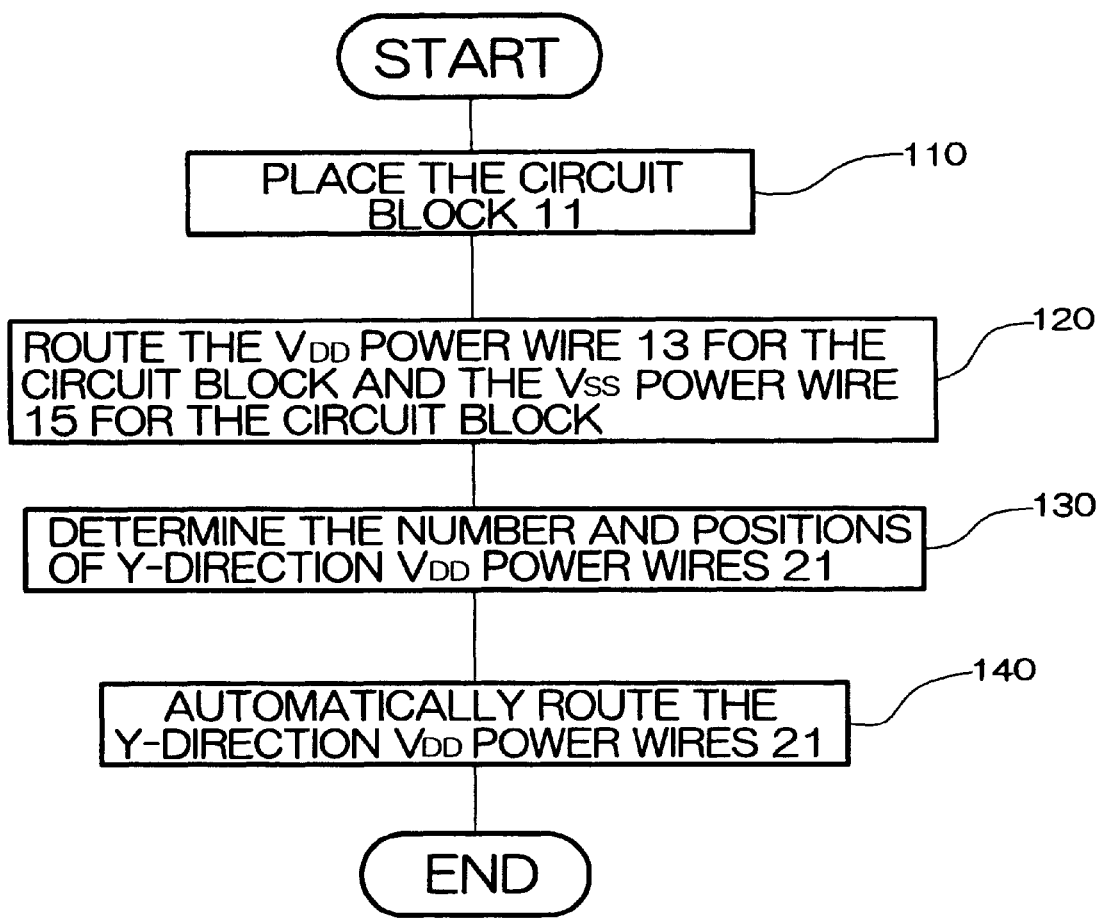
FIG. 1 is a flowchart of a method of designing a semiconductor integrated circuit 1 in accordance with a first embodiment of the present invention.
Figure 2:
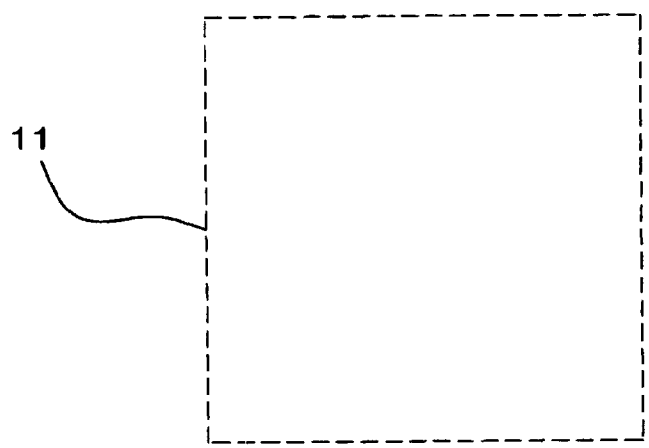
FIG. 2 is a plan view of an integrated circuit design region in a first design step of the semiconductor integrated circuit 1 in accordance with the first embodiment of the present invention.
Figure 3:
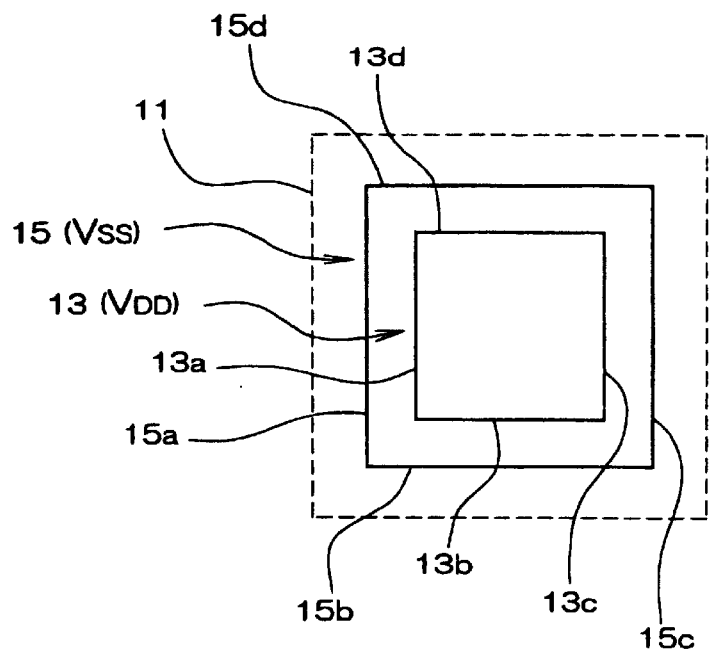
FIG. 3 is a plan view of an integrated circuit design region in a second design step of the semiconductor integrated circuit 1 in accordance with the first embodiment of the present invention.

The method of designing the semiconductor integrated circuit 1 in accordance with the first embodiment of the present invention will now be described with reference to FIGS. 1 to 4. FIG. 1 is a flowchart of the method of designing the semiconductor integrated circuit 1. FIGS. 2 and 3 are plan views of the integrated circuit design region during the various stages of the design of the semiconductor integrated circuit 1. This first embodiment of the invention relates to a method of using a software program of an automated placement-routing to design the layout of the semiconductor integrated circuit 1.

Note that, in this document, automated placement-routing refers to the process of placement-routing blocks such as circuit blocks and wires, including power wires, automatically. Automated routing refers to the process of routing a wire, including a power wire, automatically. Automated placement refers to the process of placing blocks, including circuit blocks, automatically.

First of all, the circuit block 11 is placed by an automated placement-routing program, as shown in FIG. 2 (step 110).

The $V_{DD}$ power wire 13 for the circuit block and the $V_{SS}$ power wire 15 for the circuit block are then routed within the circuit block 11, as shown in FIG. 3 (step 120). This routing is done either manually or by the automated placement-routing program. Either of the $V_{DD}$ power wire 13 for the circuit block or the $V_{SS}$ power wire 15 for the circuit block could be routed first.

The number and positions of the y-direction $V_{DD}$ power wires 21 are then determined from considerations such as the chip size of the semiconductor integrated circuit 1, the position of the circuit block 11, the number of other circuit blocks, and the positions of other circuit blocks, as shown in FIG. 4 (step 130). During this time, it is determined that the y-direction $V_{DD}$ power wires 21A, 21B, and 21C are selected within the circuit block 11 and the neighborhood, but the y-direction $V_{DD}$ power wire 21D is not selected. The y-direction $V_{DD}$ power wires 21A and 21B extend on the circuit block 11 to form power wires that are connected to the edge 13d of the $V_{DD}$ power wire 13 for the circuit block. The y-direction $V_{DD}$ power wire 21C extends on a region in the neighborhood of the circuit block 11 to form a power wire that is connected to a $V_{DD}$ power wire for circuit blocks other than the circuit block 11.

The reason why the y-direction $V_{DD}$ power wire 21D is determined to be not selected is discussed below. Since the $V_{DD}$ power wire 21D and the edge 15c of the $V_{SS}$ power wire 15 both extend in the y-direction, they are positioned in the same layer. The x-coordinate of the $V_{DD}$ power wire 21D is the same as that of the edge 15c of the $V_{SS}$ power wire 15. For that reason, the $V_{DD}$ power wire 21D overlays the routing position of the edge 15c of the $V_{SS}$ power wire 15. Since the $V_{DD}$ power wire 21D is to be used without connection to the edge 15c of the $V_{SS}$ power wire 15, it is not possible to select the $V_{DD}$ power wire 21D.

The y-direction $V_{DD}$ power wires 21 (the y-direction $V_{DD}$ power wires 21A, 21B, and 21C) are then routed automatically (step 140).

This completes the design of the semiconductor integrated circuit 1. The main effects of this embodiment of the invention will now be described. These effects are also achieved by the second embodiment of the invention, which will be described next. This embodiment of the invention makes it possible to reduce or even eliminate the corrections required after the y-direction $V_{DD}$ power wires 21 have been routed automatically. Before discussing the reasons therefor, the description concerns the corrections required after automated routing. When one of the y-direction $V_{DD}$ power wires 21 and the edge 15c of the $V_{SS}$ power wire 15 for the circuit block should overlap after the automated routing, by way of example, it is necessary to correct that portion. This correction can be done by using jogging or a similar motion of the automated placement-routing tool to correct the positions of the y-direction $V_{DD}$ power wires 21 in such a manner that there are no problems either logically or from the design rule point of view. Note that if a problem should occur during this process, the designers can correct the y-direction $V_{DD}$ power wires 21 manually.

With this embodiment of the invention, the y-direction $V_{DD}$ power wires 21 are routed automatically after the $V_{DD}$ power wire 13 for the circuit block and the $V_{SS}$ power wire 15 for the circuit block have been routed, with consideration of the positions thereof. For that reason, it is possible to reduce or even eliminate the above described possibility of overlapping. This therefore makes it possible to reduce or even eliminate the need for corrections to the y-direction $V_{DD}$ power wires 21 after the automated routing thereof.

Second Embodiment

Figure 9:
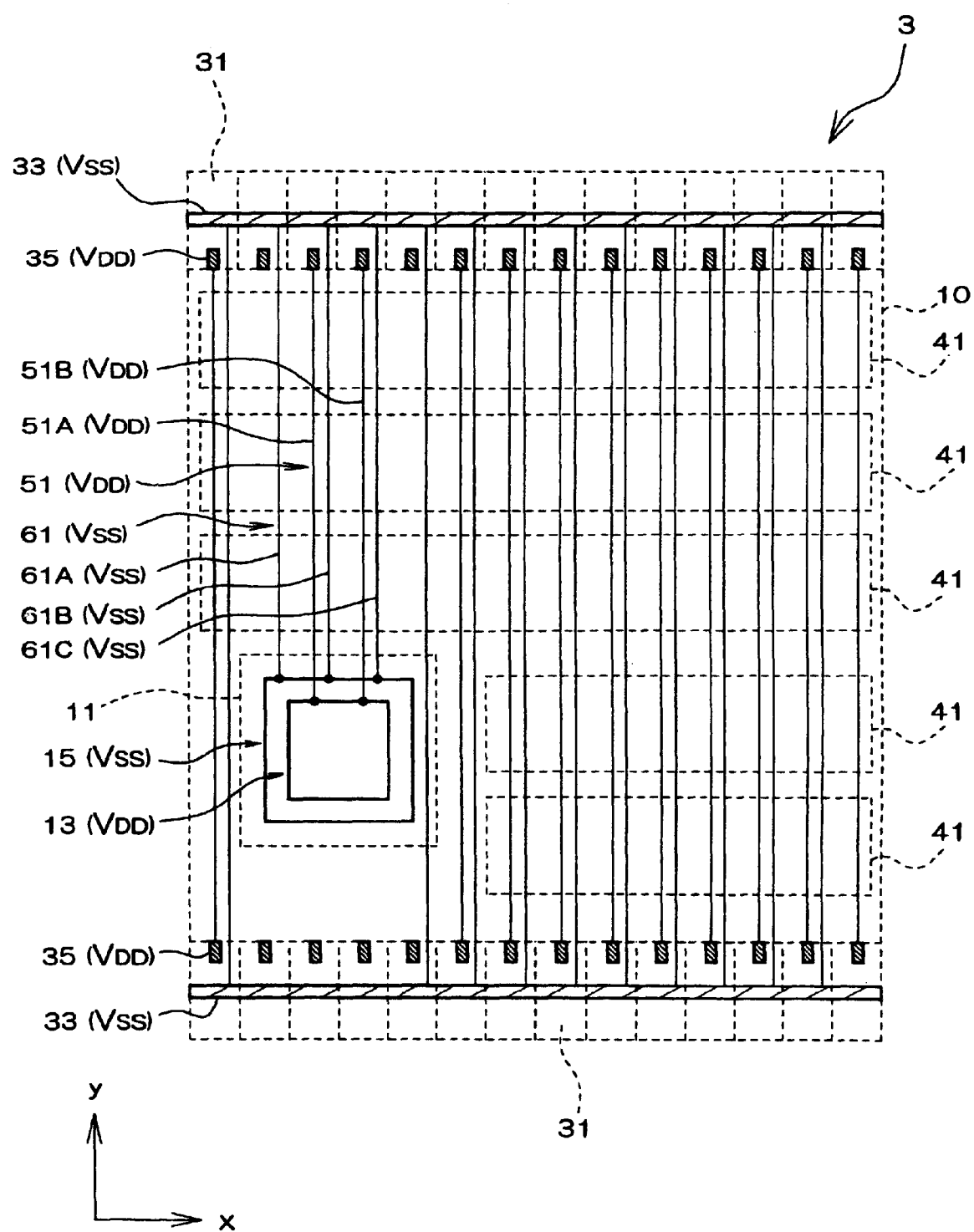
FIG. 9 is a plan view of the semiconductor integrated circuit 3 in accordance with the second embodiment of the present invention.

The description now turns to a second embodiment of the present invention, with reference to the accompanying drawings. A plan view of a semiconductor integrated circuit 3 in accordance with the second embodiment of the present invention is shown in FIG. 9. This description of the semiconductor integrated circuit 3 mainly focuses on differences from the semiconductor integrated circuit 1 of the first embodiment of the present invention, shown in FIG. 4. Note that structural components that are the same as those in the semiconductor integrated circuit 1 are denoted by the same reference numbers.

The semiconductor integrated circuit 3 comprises a large number of I/O ports 31, the circuit block 11, and a large number of random logic circuit blocks 41. These components are formed in an integrated circuit design region 10 of the semiconductor integrated circuit 3. Note that the integrated circuit design region 10 can be of any shape, but in this embodiment it is quadrilateral.

The I/O ports 31 are placed on edge portions of the integrated circuit design region 10. However, it should be noted that only the I/O ports 31 on the upper and lower sides are shown in the figures and the I/O ports on the sides are omitted. Each of these I/O ports functions as at least one of an input and an output port.

The I/O ports 31 are provided with $V_{SS}$ power wires 33 for the I/O ports and $V_{DD}$ power wires 35 for the I/O ports. There are two $V_{SS}$ power wires 33 for the I/O ports. One is placed so as to traverse all the I/O ports 31 placed on the upper side. The other is placed so as to traverse all the I/O ports 31 placed on the lower side. The $V_{DD}$ power wires 35 for the I/O ports are placed on the I/O ports 31. Note that the $V_{SS}$ power wires 33 for the I/O ports also appear herein as the $V_{SS}$ power wires 33. Similarly, the $V_{DD}$ power wires 35 for the I/O ports also appear herein as the $V_{DD}$ power wires 35.

The circuit block 11 described with reference to the first embodiment is placed in a corner of the integrated circuit design region 10. The $V_{DD}$ power wire 13 for the circuit block and the $V_{SS}$ power wire 15 for the circuit block are placed within the circuit block 11.

The plurality of random logic circuit blocks 41 is within the integrated circuit design region 10, placed outside of the regions in which the I/O ports 31 and the circuit block 11 are placed. The random logic circuit blocks 41 could be MSI cells, by way of example. Note that the random logic circuit blocks 41 can be of any shape, but in this embodiment they are rectangles with the longitudinal direction thereof being in the x-direction.

The y-direction $V_{DD}$ power wires 51 and a y-direction $V_{SS}$ power wires 61 each extend in a linear fashion in the y-direction on the integrated circuit design region 10. Note that the y-direction $V_{DD}$ power wires 51 also appear herein as the $V_{DD}$ power wires 51. Similarly, the y-direction $V_{SS}$ power wires 61 appear herein as the $V_{SS}$ power wires 61.

The y-direction $V_{DD}$ power wires 51A and 51B of the y-direction $V_{DD}$ power wires 51 are connected to the $V_{DD}$ power wire 13 for the circuit block and the $V_{DD}$ power wires 35 for the I/O ports. The other y-direction $V_{DD}$ power wires 51 supply power to the random logic circuit blocks 41. y-direction $V_{SS}$ power wires 61A, 61B, and 61C of the y-direction $V_{SS}$ power wires 61 are connected to the $V_{SS}$ power wire 15 for the circuit block and the $V_{SS}$ power wire 33 for the I/O ports that is at the upper side in the figure. The other y-direction $V_{SS}$ power wires 61 supply power to the random logic circuit blocks 41.

Figure 5:
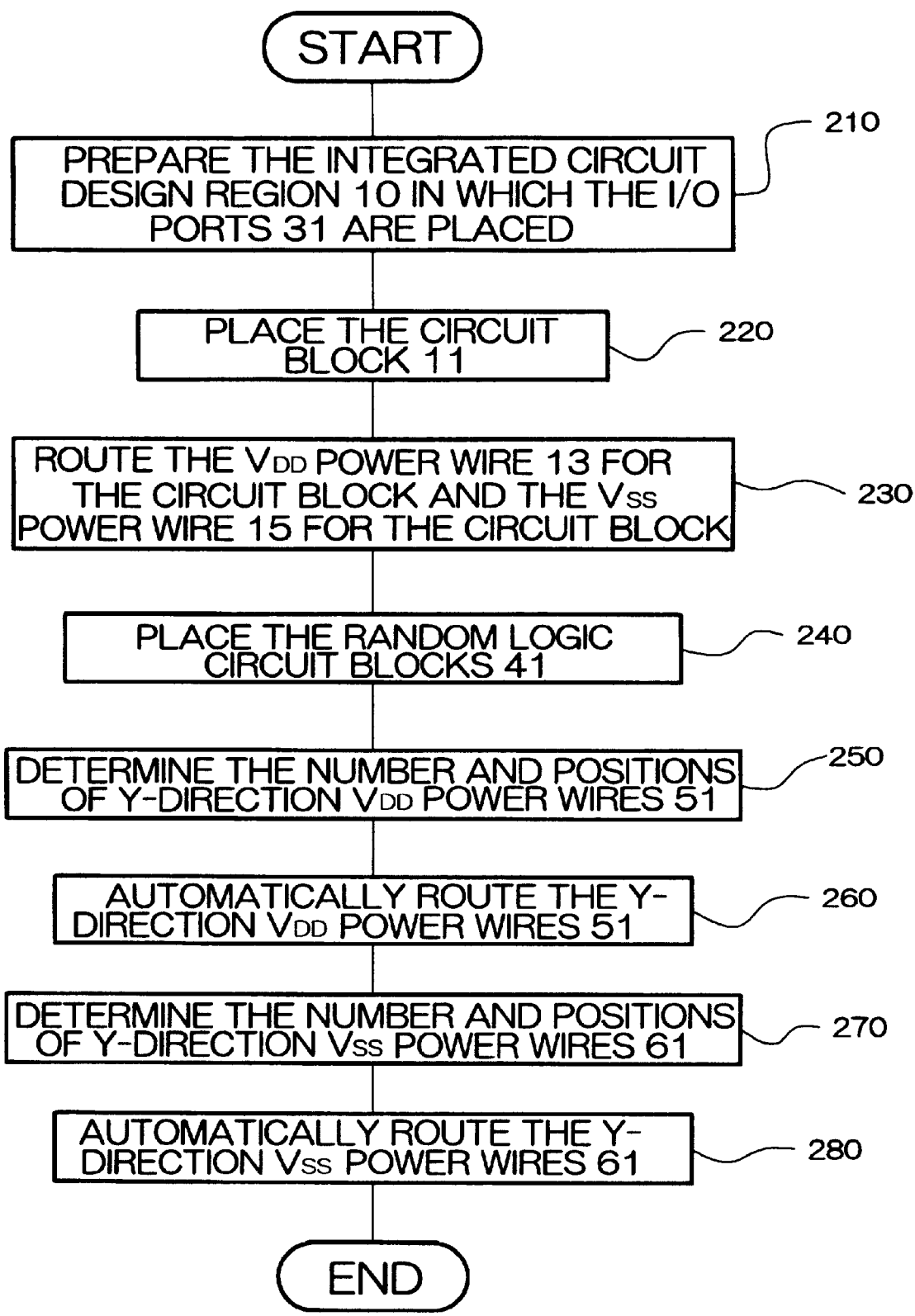
FIG. 5 is a flowchart of a method of designing a semiconductor integrated circuit 3 in accordance with a second embodiment of the present invention.
Figure 6:
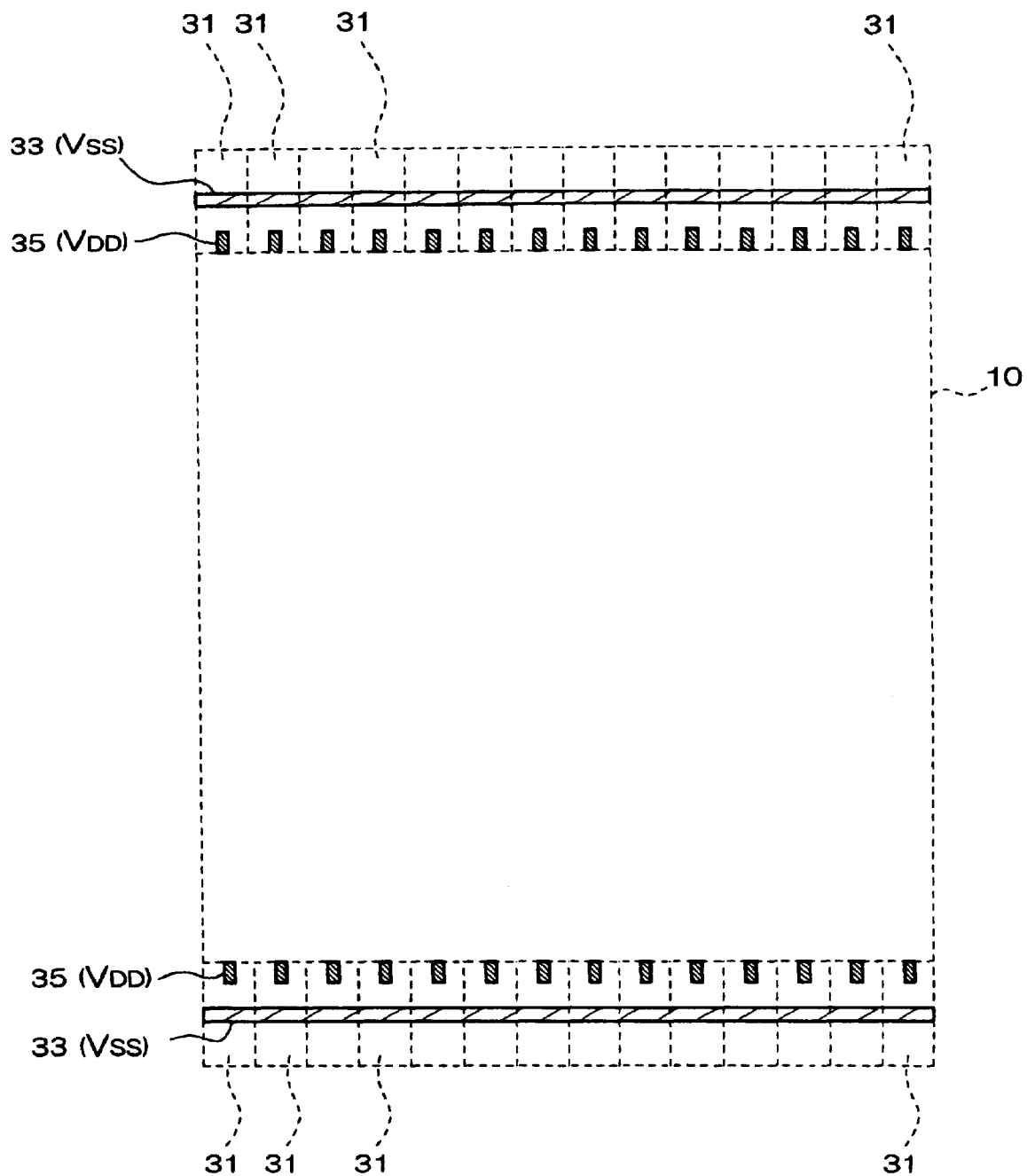
FIG. 6 is a plan view of the integrated circuit design region 10 in a first design step of the semiconductor integrated circuit 3 in accordance with the second embodiment of the present invention.
Figure 7:
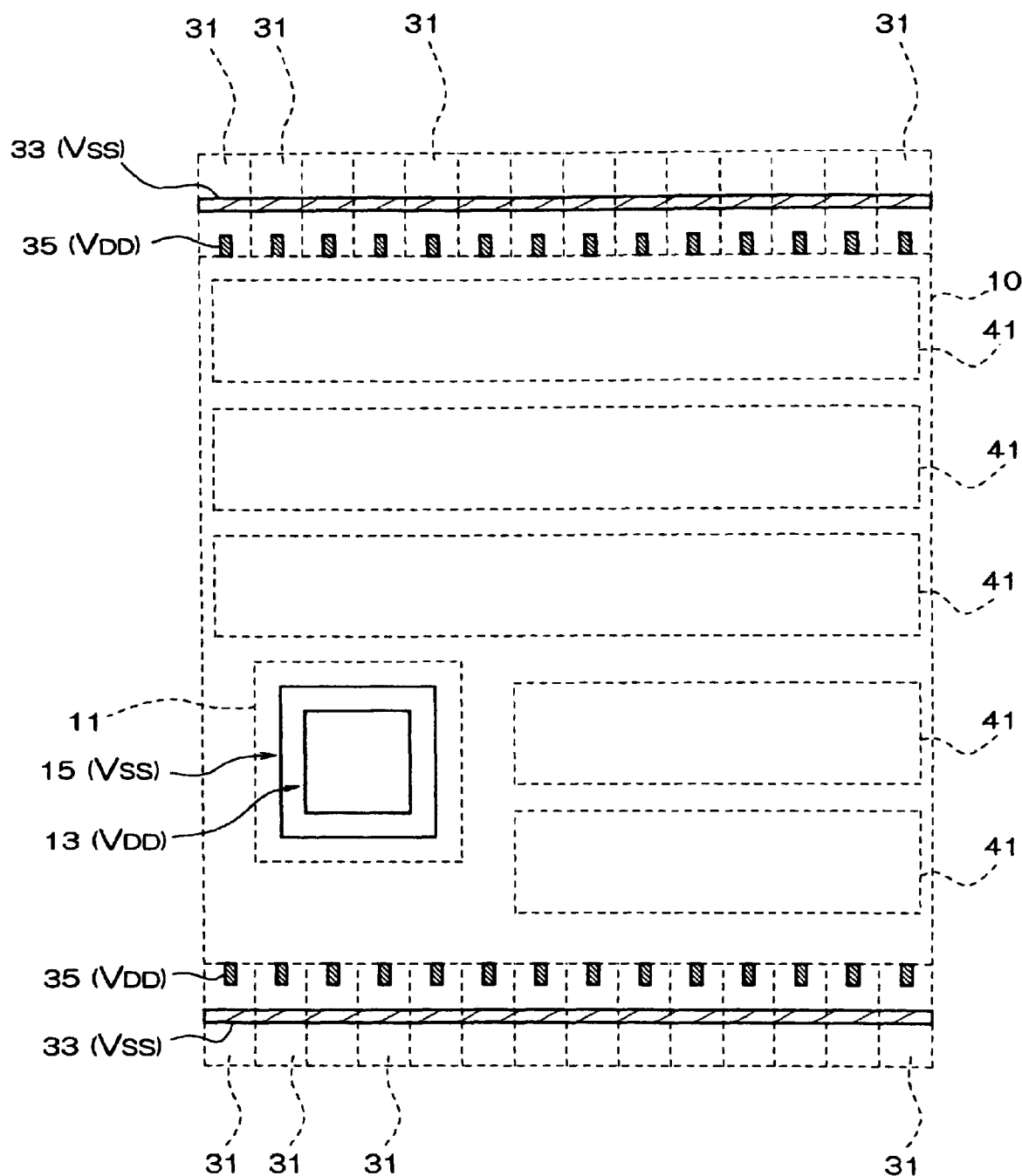
FIG. 7 is a plan view of an integrated circuit design region 10 in a second design step of the semiconductor integrated circuit 3 in accordance with the second embodiment of the present invention.
Figure 8:
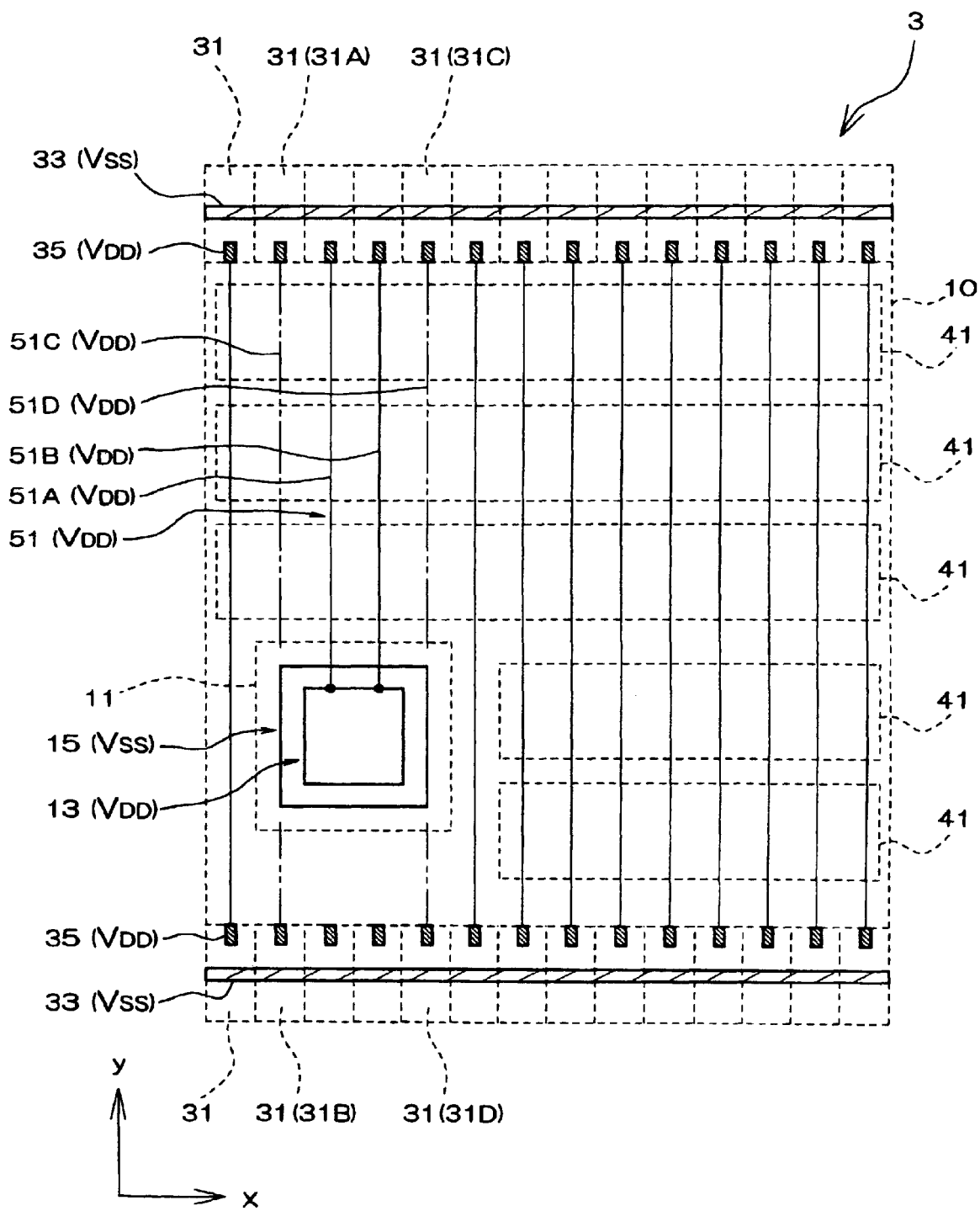
FIG. 8 is a plan view of an integrated circuit design region 10 in a third design step of the semiconductor integrated circuit 3 in accordance with the second embodiment of the present invention.

The method of designing the semiconductor integrated circuit 3 in accordance with the second embodiment of the present invention will now be described with reference to FIGS. 5 to 9. FIG. 5 is a flowchart of the method of designing the semiconductor integrated circuit 3. FIGS. 6 to 8 are plan views of the integrated circuit design region 10 during the various stages of designing the semiconductor integrated circuit 3. This second embodiment of the invention relates to a method of designing standard cells by automated placement-routing. In other words, this is a method of using a software program of an automated placement-routing to design the standard cells. In this embodiment, it is assumed that the I/O ports 31, the circuit block 11, and the random logic circuit blocks 41 had been stored in a cell library beforehand.

First of all, as shown in FIG. 6, the integrated circuit design region 10 in which a large number of the I/O ports 31 are placed is prepared (step 210). The I/O ports 31 are placed by the automated placement-routing program. The $V_{SS}$ power wires 33 and the $V_{DD}$ power wire 35 are placed for the I/O ports 31.

The circuit block 11 is placed by the automated placement-routing program, as shown in FIG. 7 (step 220). The $V_{DD}$ power wire 13 for the circuit block and the $V_{SS}$ power wire 15 for the circuit block are then routed within the circuit block 11 (step 230). This routing is done either manually or by the automated placement-routing program. Either of the $V_{DD}$ power wire 13 for the circuit block or the $V_{SS}$ power wire 15 for the circuit block could be routed first. The positions of the random logic circuit blocks 41 are then determined by the automated placement-routing program (step 240).

The number and positions of the y-direction $V_{DD}$ power wires 51 are then determined from considerations such as the chip size of the semiconductor integrated circuit 3 and the position of the circuit block 11, as shown in FIG. 8 (step 250). During this time, it is determined that the y-direction $V_{DD}$ power wires 51A and 51B are selected within the circuit block 11 but the y-direction $V_{DD}$ power wires 51C and 51D is not selected. The reason therefor has already been discussed with reference to the first embodiment. The y-direction $V_{DD}$ power wires 51 are then routed automatically (step 260). Since the $V_{DD}$ power wires 51C and 51D are not selected, they are not routed. Since not all of the I/O ports 31 are used with a standard cell, the non-selection of the $V_{DD}$ power wires 51C and 51D does not cause problems.

The number and positions of the y-direction $V_{SS}$ power wires 61 are then determined from considerations such as the chip size of the semiconductor integrated circuit 3 and the position of the circuit block 11, as shown in FIG. 9 (step 270). Since there are no obstructions to the routing of the y-direction $V_{SS}$ power wires 61, all of the y-direction $V_{SS}$ power wires 61 are selected. The y-direction $V_{SS}$ power wires 61 are then routed automatically (step 280). This completes the design of the semiconductor integrated circuit 3. The effects of this embodiment of the invention will now be discussed. With a standard cell, not all of the I/O ports 31 are used. It is therefore possible to automatically route the y-direction $V_{DD}$ power wires 51 and the y-direction $V_{SS}$ power wires 61 at preferred positions after the circuit block 11 and the random logic circuit blocks 41 have been placed.

Note that there is only one circuit block 11 in the first and second embodiments, but the present invention can also be applied to a case in which there is a plurality thereof.

What is claimed is:

1. A method of designing a semiconductor integrated circuit, comprising:

providing an upper layer;

providing a lower layer;

providing an interlayer dielectric layer disposed between the upper layer and the lower layer, the interlayer dielectric layer having a conductive portion disposed in a through hole extending through the interlayer dielectric layer;

placing a circuit block;

routing a power wire within a circuit block, wherein the power wire supplies power to the circuit block, the power wire including a first edge extending in a first direction and a second edge extending in a second direction; and selecting a first-direction power wire to be routed in a first direction by automated routing, after the step of routing the power wire for a circuit block, taking into consideration a position of the power wire for a circuit block, wherein the first-direction power wire and the second edge of the encircling power wire are each positioned in one of the upper and the lower layers, and wherein the first-direction power wire is connected to the second edge of the encircling power wire by the conductive portion.

2. A method of designing a semiconductor integrated circuit, comprising:

proving an upper layer;

providing a lower layer;

providing an interlayer dielectric layer disposed between the an upper layer and the a lower layer, the interlayer dielectric layer having a conductive portion disposed in a through hole extending through the interlayer dielectric layer;

placing a circuit block;

routing an encircling power wire inside the circuit block, wherein the encircling power wire supplies power to the circuit block, wherein the encircling power wire comprises a first edge extending in a first direction and a second edge extending in a second direction; and selecting a position of a first-direction power wire that extends in the first direction, wherein the position of the first-direction power wire is based on a position of the circuit block, wherein the position of the first-direction power wire avoids a wire at a position that overlays the first edge, and wherein the position of the first-direction power wire enables connection of the first-direction power wire to the second edge wherein the first-direction power wire and the second edge of the encircling power wire are each positioned in one of the upper and the lower layers, and wherein the first-direction power wire is connected to the second edge of the encircling power wire by the conductive portion.

3. A method of designing a semiconductor integrated circuit, comprising:

providing an upper layer;

providing a lower layer;

providing an interlayer dielectric layer disposed between the upper layer and the lower layer, the interlayer dielectric layer having a conductive portion disposed in a through hole extending through the interlayer dielectric layer;

placing an I/O port;

placing a circuit block;

routing a power wire within a circuit block, wherein the power wire includes a first edge extending in a first direction and a second edge extending in a second direction and supplies power to the circuit block; and selecting a first-direction power wire that is routed by automated routing, wherein the first-direction power wire is directly connected to the I/O port, after routing the power wire for a circuit block, from consideration of a position of the power wire for a circuit block, wherein the first-direction power wire and the second edge of the encircling power wire are each positioned in one of the upper and the lower layers, and wherein the first-direction power wire is connected to the second edge of the encircling power wire by the conductive portion.

4. A method of designing a semiconductor integrated circuit, comprising:

providing an upper layer;

providing a lower layer;

providing an interlayer dielectric layer disposed between the upper layer and the lower layer, the interlayer dielectric layer having a conductive portion disposed in a through hole extending through the interlayer dielectric layer;

placing a circuit block;

routing a power wire within a circuit block, wherein the power wire supplies power to the circuit block; and selecting a power wire to be routed by automated routing from consideration of a position of the circuit block, wherein the first-direction power wire and the second edge of the encircling power wire are each positioned in one of the upper and the lower layers, and wherein the first-direction power wire is connected to the second edge of the encircling power wire by the conductive portion.

* * * * *